(12) United States Patent  (10) Patent No.: US 8,089,744 B1
Rahim et al.  (45) Date of Patent: Jan. 3, 2012

(54) APPARATUS AND METHODS FOR ELECTROSTATIC DISCHARGE CIRCUITRY WITH SNAP-BACK DEVICE

(75) Inventors: Irfan Rahim, San Jose, CA (US); Cheng Hsiung Huang, Cupertino, CA (US); Yow-Juang Bill Liu, San Jose, CA (US); Jeffrey T. Watt, Palo Alto, CA (US); Hugh Sung-Ki O, Fremont, CA (US)

(73) Assignee: Altera Corporation, San Jose, CA (US)

( * ) Notice: Subject to any disclaimer, the term of this patent is extended or adjusted under 35 U.S.C. 154(b) by 991 days.

(21) Appl. No.: 11/211,060

(22) Filed: Aug. 24, 2005

(51) Int. Cl.
*H02H 3/22* (2006.01)
(52) U.S. Cl. .......................... 361/111; 361/56
(58) Field of Classification Search .......... 361/56, 361/91.1, 111
See application file for complete search history.

(56) References Cited

U.S. PATENT DOCUMENTS

| 5,701,024 | A  | * | 12/1997 | Watt ............................. 257/360 |
|---|---|---|---|---|
| 6,335,636 | B1 | * | 1/2002 | Yeung et al. ................... 326/41 |
| 6,583,972 | B2 |   | 6/2003 | Verghese et al. ............... 361/56 |
| 6,646,840 | B1 | * | 11/2003 | Sugerman et al. ............. 361/56 |
| 6,898,062 | B2 | * | 5/2005 | Russ et al. ..................... 361/56 |
| 6,939,752 | B1 | * | 9/2005 | Liu et al. ....................... 438/151 |
| 2004/0160717 | A1 | * | 8/2004 | May et al. .................... 361/91.5 |
| 2005/0180073 | A1 | * | 8/2005 | Armer et al. .................... 361/56 |
| 2005/0253626 | A1 | * | 11/2005 | Chong et al. ................... 326/82 |

* cited by examiner

*Primary Examiner* — Jared Fureman
*Assistant Examiner* — Terrence Willoughby
(74) *Attorney, Agent, or Firm* — Law Offices of Maximilian R. Peterson (57) ABSTRACT

An integrated circuit (IC) includes a multiple-finger transistor structure. The multiple-finger transistor structure includes one transistor configured as a ballasted device. The multiple-finger transistor structure further includes a second transistor configured as a trigger device for the ballasted device.

10 Claims, 7 Drawing Sheets

APPARATUS AND METHODS FOR ELECTROSTATIC DISCHARGE CIRCUITRY WITH SNAP-BACK DEVICE

TECHNICAL FIELD

The inventive concepts relate generally to circuitry and associated methods for protecting electronic circuits. More particularly, the invention concerns electrostatic discharge (ESD) circuitry for use in integrated circuits (ICs), and associated methods.

BACKGROUND

Modern ICs tend to use increasingly small devices, such as transistors. To reduce the physical size and to increase performance, typical devices use thin gate dielectrics. The thin dielectric, however, makes the device more susceptible to ESD. Conventional ESD protection circuits have used a variety of techniques to prevent damage in the event of an ESD. That protection, however, has tended to reduce the performance of the IC. A need exists for ESD circuits that effective protect the IC, yet provide relatively high input/output (I/O) performance.

SUMMARY

The disclosed novel concepts relate to apparatus and methods for ESD circuits that effective protect an IC and further provide relatively high performance. In one embodiment, an IC includes a multiple-finger transistor structure. The multiple-transistor structure includes a transistor configured as a ballasted device. The multiple-finger structure also includes another transistor configured as a trigger device for the ballasted device.

In another embodiment, an IC includes an ESD circuit coupled to an I/O pad. The ESD circuit has a steady-state mode of operation, a hot-socket mode of operation, and an ESD mode of operation.

Yet another embodiment relates to a method of laying out a circuit for an ESD device that includes a multiple-finger transistor structure. The method includes laying out one semiconductor area that corresponds to a ballasted device in the multiple-finger transistor structure, and laying out another semiconductor area corresponds to a trigger device of the multiple-finger transistor structure. The semiconductor area corresponding to the trigger device is positioned centrally with respect to the semiconductor area that corresponds to the ballasted device.

BRIEF DESCRIPTION OF THE DRAWINGS

The appended drawings illustrate only exemplary embodiments of the invention and therefore should not be considered or construed as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate ESD circuits for use in a wide variety of ICs, such as programmable logic devices (PLDs). The ESD circuits protect the IC against potential damage by ESD events. In addition, the ESD circuits can support hot-socket operation, as desired.

The inventive ESD circuits provides several advantages, as the description in this document makes apparent to persons of ordinary skill in the art. First, it provides a trigger for the ballasted ESD transistor, thus allowing relatively precise control of snap-back voltage. Second, it provides for snap-back voltage engineering with little or no impact to the ballast device characteristics. Third, it minimizes impact to the I/O performance by minimizing capacitance in the I/O path. The ESD circuit also meets hot-socket and ESD specifications simultaneously, thus providing a high-performance I/O solution.

Figure 1:
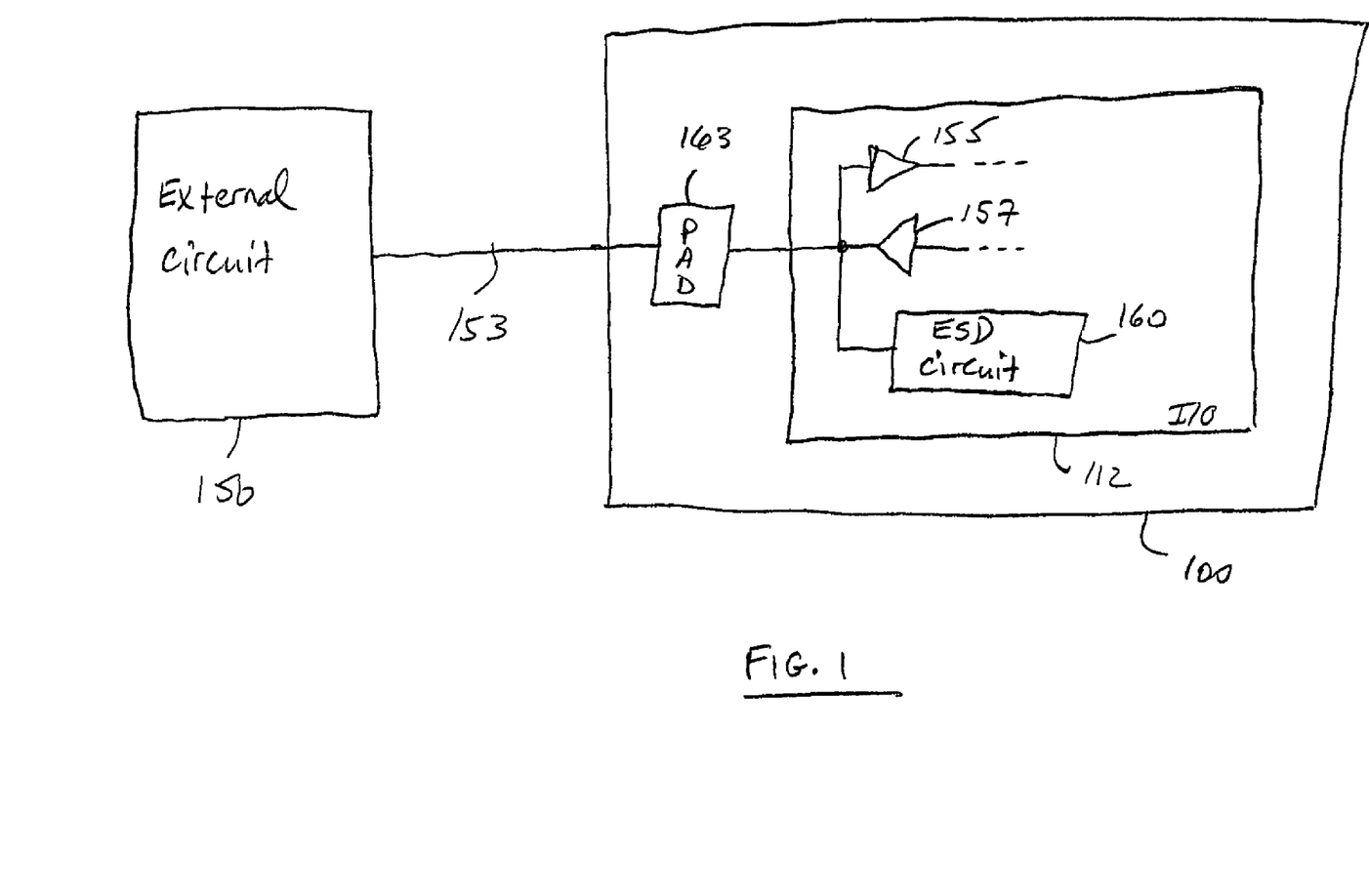
FIG. 1 shows a circuit arrangement that includes an ESD circuit according to an exemplary embodiment of the invention.

FIG. 1 shows a circuit arrangement that includes ESD circuit according to an exemplary embodiment of the invention. The circuit arrangement includes IC 100 coupled to an external circuit 150 via pad 163 of IC 100, and a coupling mechanism 153. Coupling mechanism 153 may constitute a wire, printed circuit board traces, conductors, etc.

Pad 163 couples to I/O circuitry 112. I/O circuitry 112 provides a mechanism for circuits within IC 100 to communicate with external circuit 153, as persons of ordinary skill in the art who have the benefit of the description of the invention understand. In the embodiment shown, I/O circuitry 112 includes driver 157, receiver 155, and ESD circuit 160.

Driver 157 couples to desired circuits within IC 100, and communicates information to external circuit 150 via pad 163 and coupling mechanism 153. Receiver 153 performs the inverse function. In other words, it receives information from external circuit 150 via coupling mechanism 153 and pad 163, and provides the information to desired circuits within IC 100.

ESD circuit 160 couples to pad 163. In an ESD event, ESD circuit 160 acts to clamp the voltage at pad 163 and, thus, protect the circuitry within IC 100 from damage or degradation. ESD circuit 160 can protect IC 100 even in the absence of external circuit 150 and coupling mechanism 153. For example, static electricity, conducted through the fingers or hand of a person touching pad 163, may expose IC 100 to an ESD event. ESD 160 clamps the ESD voltage at pad 160 to protect IC 100.

Note that FIG. 1 shows a simplified or general block diagram. As persons of ordinary skill in the art who have the benefit of the description of the invention understand, one may use other circuit arrangements, depending on factors such as design and performance specifications, implementation details, etc. For example, one may use part of ESD circuit 160 to perform the function of driver 157, as desired (see FIG. 6 for an example).

Figure 2:
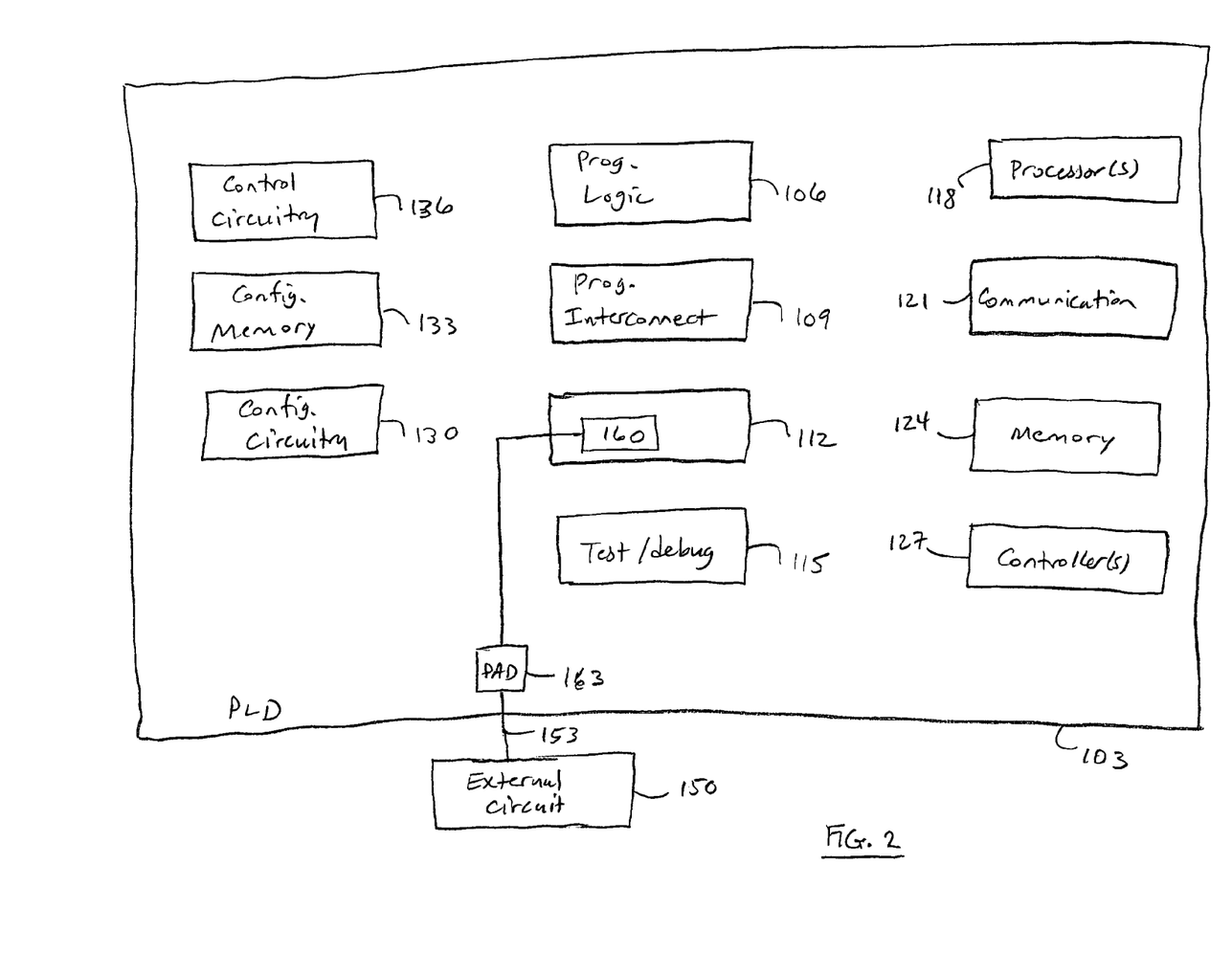
FIG. 2 illustrates a circuit arrangement that includes PLD 103 with ESD protection according to the invention.

As noted above, one may use the inventive concepts with PLDs. FIG. 2 shows a circuit arrangement that includes PLD 103 with ESD protection according to the invention (PLD 103 constitutes a special case of IC 100). PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and to other blocks and circuitry within PLD 103, as desired. As described below in detail, programmable interconnect 109 provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 133. The contents of CRAM 133 determine the functionality of various blocks of PLD 103, such as programmable logic 106 and programmable interconnect 109.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired. As persons of ordinary skill in the art who have the benefit of the description of the invention understand, rather than using a dedicated DSP, one may use the logic resources of PLD 103 to implement DSP functionality, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Regardless of the particular topology and implementation details, I/O circuitry 112 includes ESD circuit 160 for protecting various circuitry within PLD 103. More specifically, I/O circuitry 112 includes ESD circuit 160, which couples to PLD pad 163 and, optionally, to external circuit 150 via coupling mechanism 153. ESD circuit 160 can protect PLD 103 either "in-circuit" (e.g., coupled to external circuit 150), or stand-alone (e.g., not part of a circuit, but still exposed to ESD events, for example, by static electricity).

Generally speaking, in addition to the ESD protection functionality, I/O circuitry 112 may constitute a wide variety of I/O devices or circuits for performing input/output functions, as persons of ordinary skill in the art who have the benefit of the description of the invention understand. I/O circuitry 112 provides a mechanism and circuitry for various blocks within PLD 103 to communicate with external circuitry or devices, for example driver and receiver circuits (see FIG. 1), as desired.

ESD circuit 160 has three modes of operation: ESD mode, hot-socket mode, and steady-state (normal operation) mode. The following description provides details of each mode.

Figure 3:
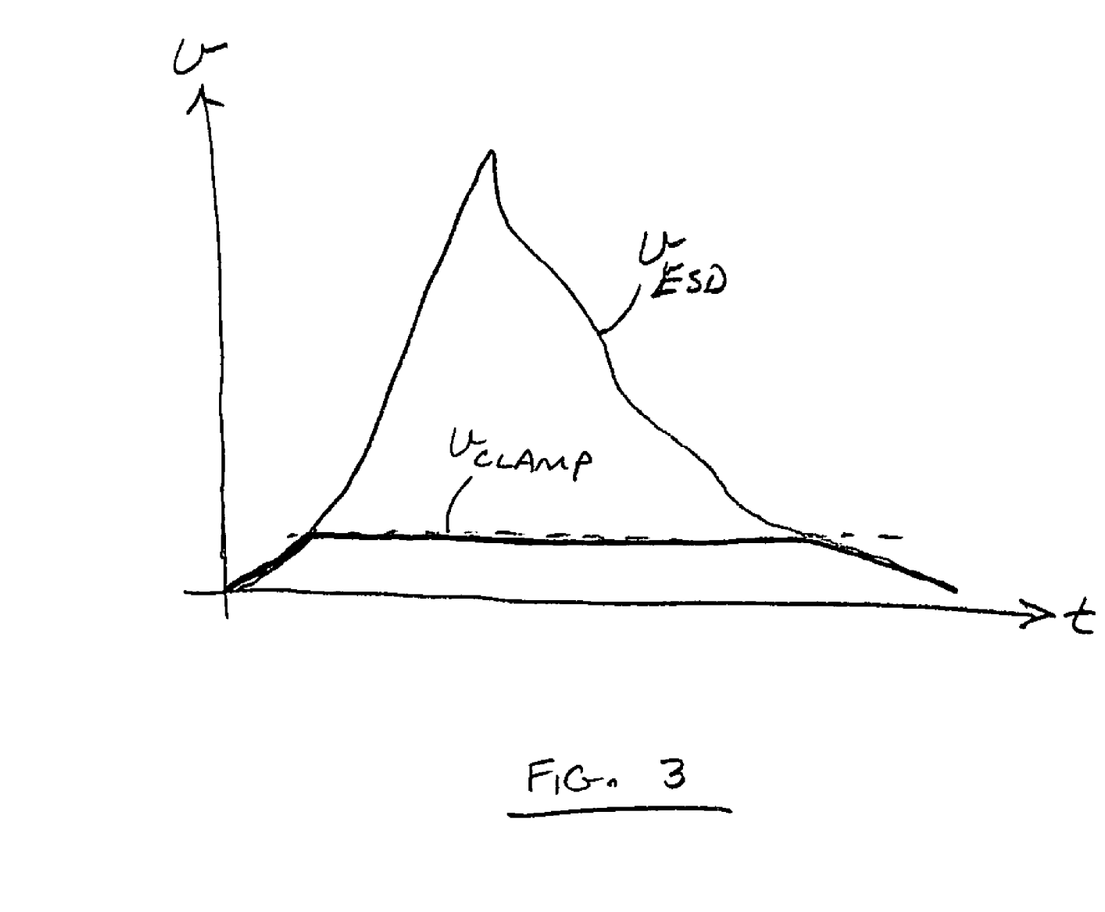
FIG. 3 depicts exemplary waveforms relating to ESD mode operation of an ESD circuit according to the invention.

FIG. 3 shows exemplary waveforms relating to ESD mode operation of the ESD circuit according to the invention. In the ESD mode of operation, IC 100 experiences a relatively large voltage at pad 163. FIG. 3 shows a waveform of that voltage, $v_{ESD}$. In the absence of ESD protection, the voltage can have large peak values that may destroy or degrade circuitry within IC 100.

By virtue of the protection that ESD circuit 160 affords, however, IC 100 experiences a clamped voltage (see waveform $v_{CLAMP}$ in FIG. 3) at pad 163. In other words, during this mode, when the pad voltage rises above a given value, ESD circuit clamps the voltage at $v_{CLAMP}$. Thus, ESD circuit 160 prevent exposure of other circuitry within IC 100 to the harmful, large peak of $v_{CLAMP}$.

Figure 4:
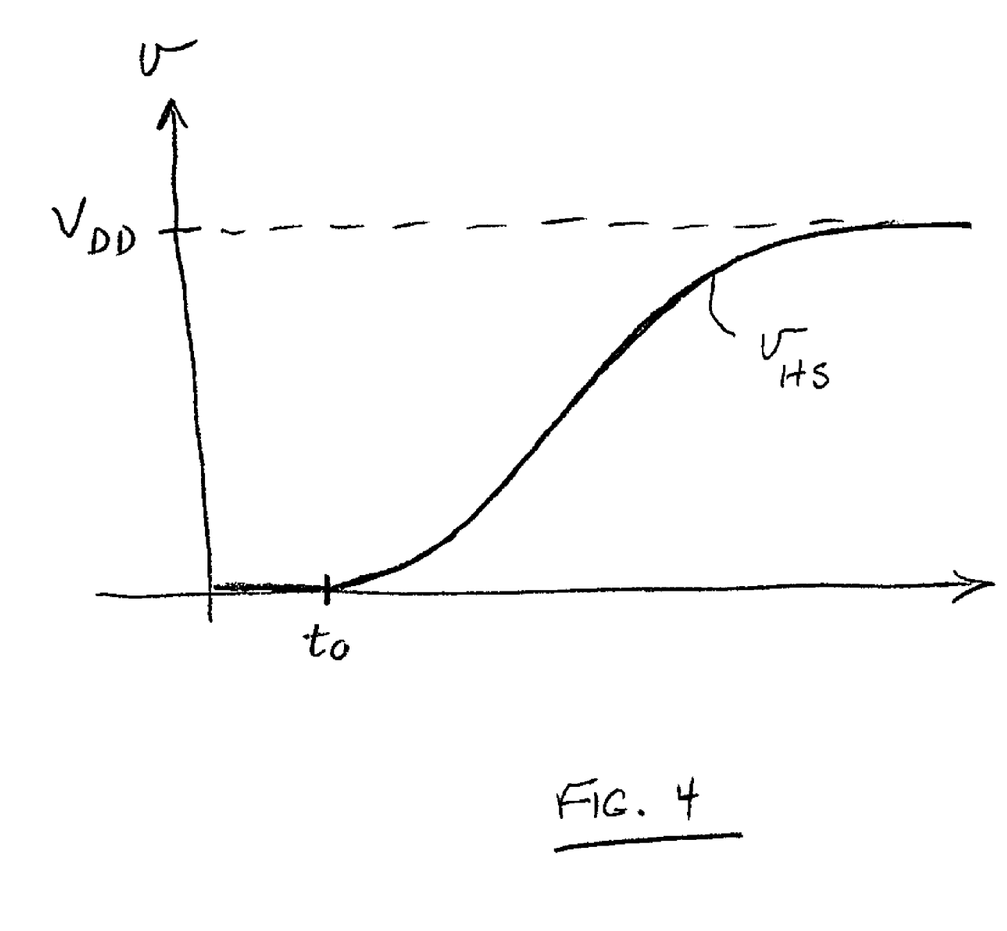
FIG. 4 shows an exemplary waveform pertaining to the hot-socket mode operation of an ESD circuit according to the invention.

In the hot-socket mode, IC 100 experiences an application of power in an unpredictable manner. More specifically, the user may apply supply voltage(s) to IC 100 with an uncertain or unknown timing. For example, one does not know in advance whether one supply voltage is applied before another supply voltage, or vice-versa.

Referring to FIG. 4, at time $t_0$, power is applied to IC 100. The supply voltage, $v_{HS}$, ramps up to the supply voltage, $V_{DD}$. This event takes place for each supply voltage of IC 100. Generally speaking, however, one does not have a priori knowledge of the sequence of the application of the various voltages to IC 100. ESD circuit 160 according to the invention has the capability of operating in this mode. To summarize, in the hot-socket mode, ESD circuit 160 can handle and accommodate random powering up of ground and supply voltages.

Figure 5:
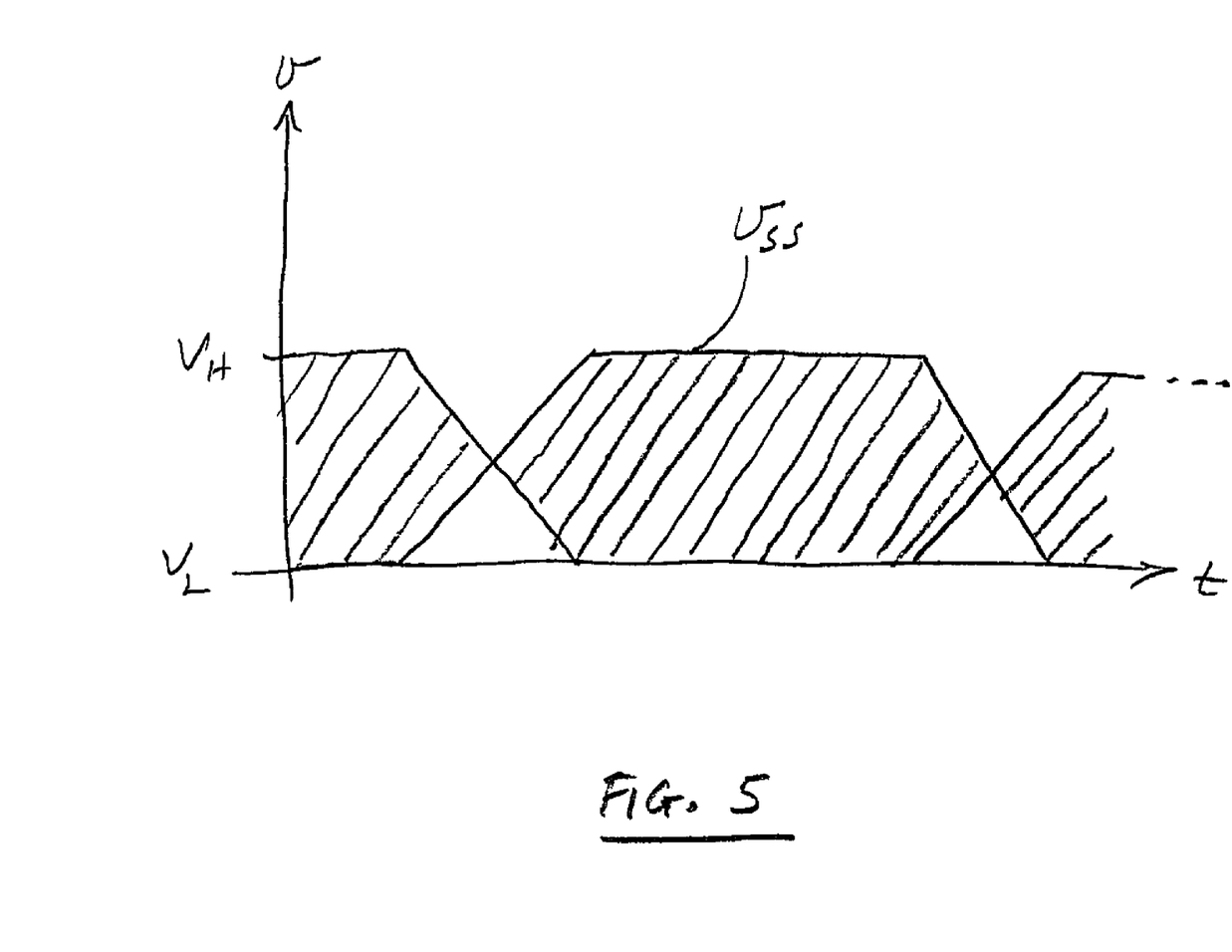
FIG. 5 illustrates exemplary waveforms relating to the steady-state mode operation of an ESD circuit according to the invention.

In the steady-state or normal mode of operation, pin 163 experiences voltages that correspond to information exchanged between IC 100 and external circuit 150 (e.g., logic signals). FIG. 5 shows example waveforms corresponding to such signals. More specifically, the voltage during steady-state operation, $v_{ss}$, may have values $V_L$ (corresponding to a low logic state), $V_H$ (corresponding to a high logic state), or high-impedance state. Various circuitry within IC 100, for example, driver 157 or receiver 155, may generate or accept $v_{ss}$.

Figure 6:
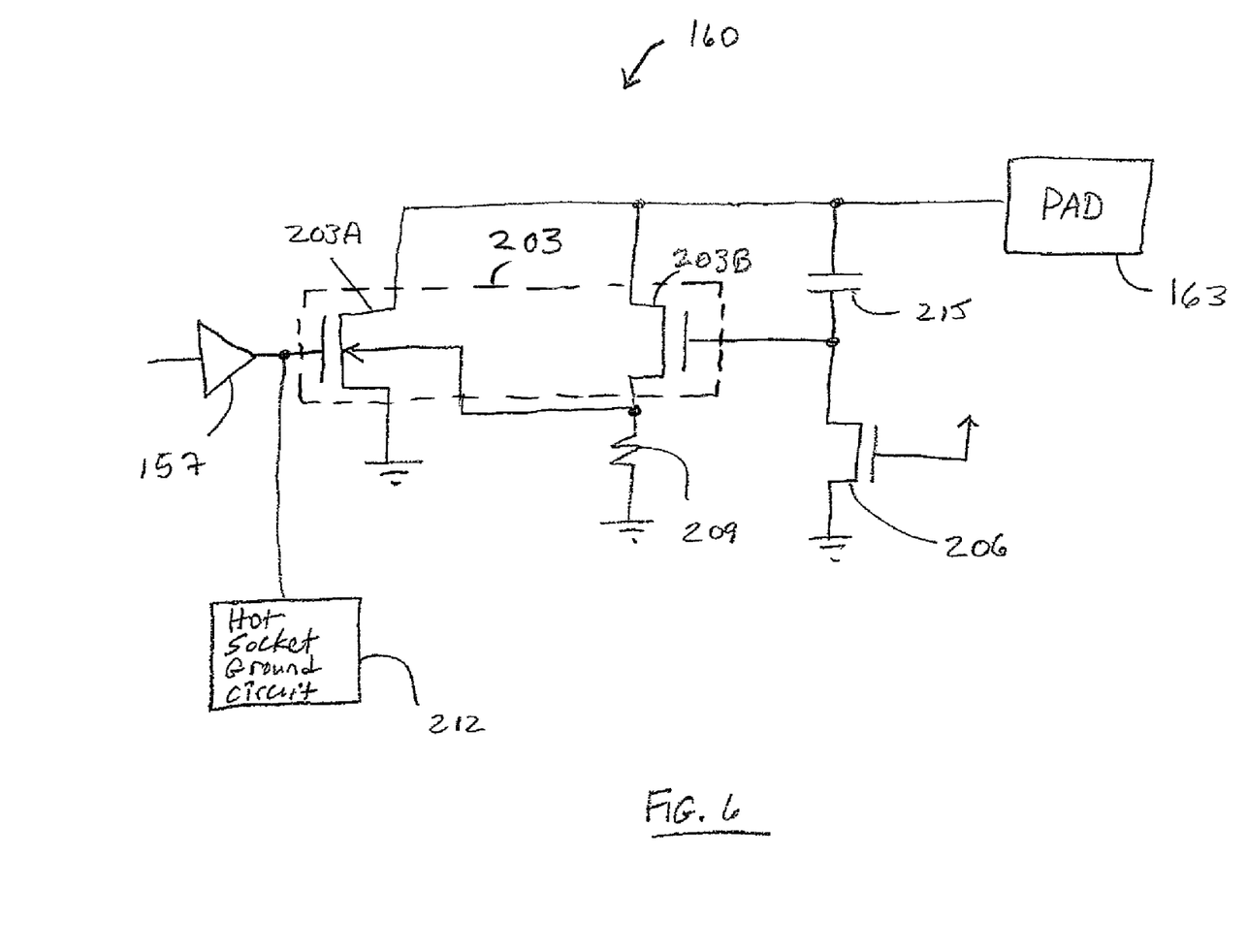
FIG. 6 depicts a circuit arrangement for an ESD circuit according to an exemplary embodiment of the invention.

FIG. 6 shows a circuit arrangement for ESD circuit 160 according to an exemplary embodiment of the invention. The circuit arrangement includes transistor 203, transistor 206, resistor 209, capacitor 215, and hot socket ground circuit 212. The circuit may include driver 157, as desired, in order to support providing information to circuitry external to ESD circuit 160 via pad 163. Transistor 206 serves as a bias device.

Transistor 203 includes ballast transistor or ballasted device 203A and triggering device or transistor 203B. Transistor 203 includes a multiple-finger structure, as persons of ordinary skill in the art who have the benefit of the description of the invention understand. Transistor 203A may include a number of transistors in the multiple-finger structure. Transistor 203B may constitute one of the transistors in the multiple-finger structure (one finger). As FIG. 6 illustrates, although they are part of the same finger structure, transistors 203A and 203B have separate gate drives.

Transistors 203A and 203B may have a desired size that depends on factors such as design and performance specifications, the fabrication technology used, implementation details, etc. For example, transistor 203A may be 320 microns wide, whereas transistor 203B may have a width of 5 microns. Of course, one may use a wide variety of other transistor sizes, as persons of ordinary skill in the art who have the benefit of the description of the invention understand. Note that the relatively small size of transistor 203B tends to reduce or minimize the capacitance that it presents to the I/O path (i.e., pad 163), thus providing relatively high I/O performance.

The finger structure may use a suitable material, such as polysilicon, as persons of ordinary skill in the art who have the benefit of the description of the invention understand. When an ESD event occurs, each transistor in the finger structure turns on and shunts current to ground, thus protecting the IC in which ESD circuit 160 resides. In order to avoid excessive concentration of current density, the transistors in the finger structure turn on simultaneously or nearly simultaneously.

As noted above, the circuit has three modes of operation, steady-state, ESD, and hot-socket. In the steady-state (normal) mode, the gate of transistor 206 is coupled to the supply voltage, which turns ON transistor 206. Current conduction in transistor 206 grounds the gate of transistor 203B, effectively turning it OFF. Because no or little current flows through transistor 203B, the body of transistor 203A has the same potential (ground) as its source (i.e., no or little voltage drop across resistor 209).

Put another way, in the steady-state mode, transistor 203B does not impact the operation of transistor 203A. Likewise, host-socket ground circuit 212 has no impact on transistor 203A (i.e., does not bias its gate). In this mode, driver 157 (or other suitable circuit) can drive the gate of transistor 203A and, hence, pad 163.

Thus, by supplying appropriate voltages to the gate of transistor 203A, one can drive pad 163 with logic low and logic high signals and therefore communicate information to circuits outside IC 100. Conversely, by turning OFF transistor 203A, one may receive information from outside IC 100 via pad 163 (i.e., allow external circuitry provide the information by driving pad 163).

In the ESD mode, the gate of transistor 206 is grounded. As a result, transistor 206 turns OFF, and presents merely a parasitic capacitance to the gate of transistor 203B. Capacitor 215 has a relatively large capacitance compared to that parasitic capacitance.

Note that transistor 203B serves as a driver transistor during steady-state operation, which may make some of its characteristics subject to I/O performance specifications. Transistor 203B, however, serves as the trigger device for transistor 203A. By controlling the relative values of the device capacitances of transistor 203B and the capacitance of capacitor 209, one may design a desired trigger point without impacting the I/O performance of transistor 203A.

In the presence of an ESD event, a relatively large voltage develops relatively rapidly at pad 163. Capacitor 215 acts momentarily as a short circuit, and drives the gate of transistor 203B hard (i.e., rapidly raises the gate voltage). As persons of ordinary skill in the art who have the benefit of the description of the invention understand, an elevated gate voltage facilitates snap back of transistor 203B. Thus, the ESD event causes transistor 203B to snap back and conduct current.

Current flow through transistor 203B results in a voltage drop across resistor 209. The voltage drop acts as a finite body-source voltage of transistor 203A, thus altering its threshold voltage.

More specifically, the threshold voltage, $V_T$, of transistor 203A depends on a number of factors, such as the voltage between its source and body. The following equation provides the threshold voltage as a function of the body-to-source voltage:

$$V_T = V_{T(0)} + \gamma \{ \sqrt{2\phi_F - v_{BS}} - \sqrt{2\phi_F} \}. \tag{1}$$

Alternatively, one may write Equation 1 in terms of the source-to-body voltage:

$$V_T = V_{T(0)} + \gamma \{ \sqrt{2\phi_F - v_{SB}} - \sqrt{2\phi_F} \}, \tag{2}$$

where
$V_{T(o)}$=the threshold voltage with the source-to-body voltage (or body-to-source voltage) set to zero;
$\gamma$=the body factor, a constant that depends on the doping levels of the body;
$\phi F$=a constant;
$v_{BS}$=the total body-to-source voltage (i.e., including AC and DC components); and
$v_{SB}$=the total source-to-body voltage (i.e., including AC and DC components).

Note that when the body-to-source voltage, vas (or source-to-body voltage, $v_{SB}$) equals zero, the threshold voltage, $V_T$, equals $V_{T(o)}$. As Equation 2 shows, for a finite body factor, $\gamma$, the transistor's threshold voltage increases as the source-to-body voltage, $v_{SB}$, increases. Thus, raising the body voltage of transistor 203A and, hence, its body-to-source voltage, results in a decreased threshold voltage.

The decreased threshold voltage helps transistor 203A to snap back. Typically, one finger in the multiple-finger structure snaps back first, and other fingers follow, resulting in snap back of the entire structure. When transistor 203A snaps back (as a result of the snap-back of transistor 203B), it couples pad 163 to ground, thus shunting and discharging the ESD energy and protecting IC 100.

During the hot-socket mode, hot-socket ground circuit 212 couples the gate of transistor 203A to ground. As a result, transistor 203A turns OFF. The voltage applied to pad 163 increases as a function of time. In the absence of an ESD event, however, the voltage does not rise sufficiently to turn ON transistor 203B hard. Rather, transistor 203B either remains OFF or turns ON slightly, and leaks a limited amount of current to ground.

If the voltage at pad 163 rises beyond the threshold voltage of transistor 203B (or rises too rapidly, similar to an ESD event), transistor 203B will turn ON, and shunt pad 163 to ground through resistor 209. Thus, in this mode, transistor 203B allows the voltage at pad 163 to rise in a controlled manner.

Table 1 below provides a summary of the state of transistors 203A, 203B, and 206 during the three modes of operation:

TABLE 1

| MODE OF OPERATION | TRANSISTOR 203A | TRANSISTOR 203B | TRANSISTOR 206 |
|---|---|---|---|
| Steady-State | Depends on gate voltage | OFF | ON |
| ESD | Snap back | Snap back | OFF |
| Hot-socket | OFF | Slightly ON | OFF |

Figure 7:
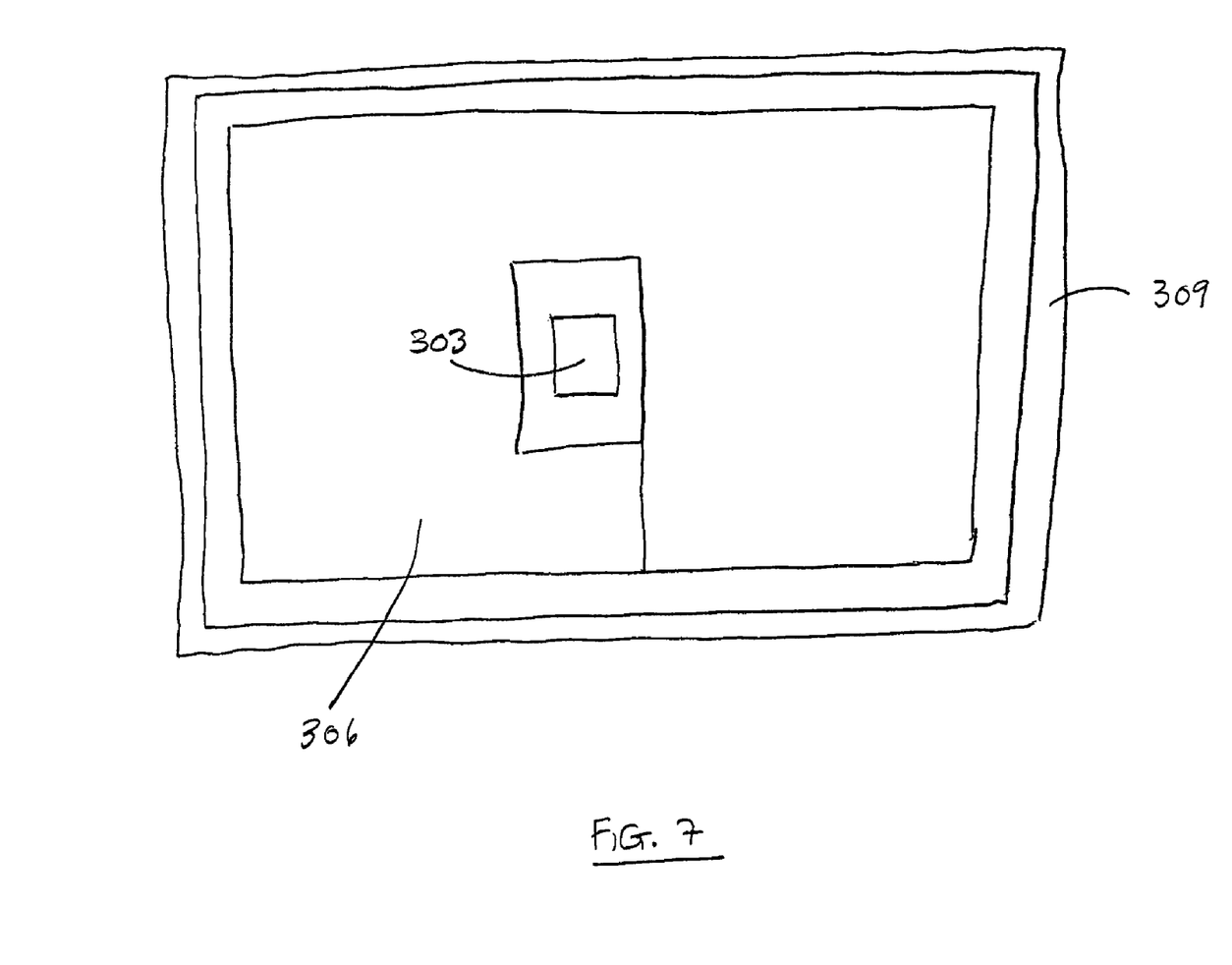
FIG. 7 shows a partial layout for an ESD circuit according to an exemplary embodiment of the invention.

FIG. 7 shows a partial layout of an ESD circuit according to an illustrative embodiment of the invention. The layout includes area 303, which houses transistor 203B (see FIG. 6), and area 306, which houses transistor 203A. Area 309 denotes a p-tap to the p-well of transistor 203A, as persons of ordinary skill in the art who have the benefit of the description of the invention understand.

The layout in FIG. 7 places transistor 203B strategically so as to facilitate snap-back of transistor 203A during an ESD event. More specifically, area 303 is centered or substantially centered with respect to area 306. The placement of the two areas provides a relatively uniform turning ON or snapping back of transistor 203B.

Although the description of the inventive concepts uses NMOS transistors as an example, persons of ordinary skill in the art who have the benefit of the description of the invention understand that one may apply the concepts to other technologies. For example, rather than using NMOS transistors, one may use PMOS transistors, or a combination (i.e., complementary metal oxide semiconductor, or CMOS), as desired.

Note that one may generally apply the inventive concepts effectively to various ICs, including programmable ICs that include programmable or configurable logic circuitry, known by various names in the art, as desired, and as persons skilled in the art with the benefit of the description of the invention understand. Such circuitry includes, for example, devices known as complex programmable logic device (CPLD), programmable gate array (PGA), structured application specific ICs (structured ASICs), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand. Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

The invention claimed is:

1. An integrated circuit (IC) comprising an electrostatic discharge (ESD) circuit coupled to an input/output (I/O) pad, wherein the ESD circuit has a steady-state mode of operation, a hot-socket mode of operation in which power is applied to the integrated circuit (IC) in an unpredictable manner, and an ESD mode of operation, wherein the ESD circuit further comprises a first transistor coupled to the I/O pad, and a hot-socket ground circuit configured to couple a gate terminal of the first transistor to ground during the hot-socket mode of operation.

2. The integrated circuit (IC) according to claim 1, wherein the I/O pad is operable to couple the integrated circuit (IC) to an external circuit.

3. The integrated circuit (IC) according to claim 1, further comprising a driver circuit coupled to the I/O pad.

4. The integrated circuit (IC) according to claim 1, further comprising a receiver circuit coupled to the I/O pad.

5. The integrated circuit (IC) according to claim 1, further comprising programmable logic coupled to the ESD circuit.

6. The integrated circuit (IC) according to claim 1, further comprising programmable interconnect coupled to the ESD circuit.

7. The integrated circuit (IC) according to claim 3, further comprising programmable logic, wherein the driver circuit is coupled to the programmable logic.

8. The integrated circuit (IC) according to claim 3, further comprising programmable interconnect, wherein the driver circuit is coupled to the programmable interconnect.

9. The integrated circuit (IC) according to claim 4, further comprising programmable logic, wherein the receiver circuit is coupled to the programmable logic.

10. The integrated circuit (IC) according to claim 4, further comprising programmable interconnect, wherein the receiver circuit is coupled to the programmable interconnect.

* * * * *